United States Patent [19]
Schmitt et al.

[11] Patent Number: 5,701,076
[45] Date of Patent: Dec. 23, 1997

[54] NMR GRADIENT POWER SUPPLY INCLUDING A RESONANT CIRCUIT HAVING A FREQUENCY WITH AN ASSOCIATED PERIOD BEING LESS THAN ONE-QUARTER DURATION OF THE GRADIENT CURRENT

[75] Inventors: Franz Schmitt, Erlangen; Stefan Nowak, Braeuninghof, both of Germany

[73] Assignee: Siemens Aktiengesellschaft, Munich, Germany

[21] Appl. No.: 617,568

[22] Filed: Mar. 19, 1996

[30] Foreign Application Priority Data

Mar. 30, 1995 [DE] Germany .................. 195 11 833.2

[51] Int. Cl.⁶ .................... G01R 33/36; A61B 5/055
[52] U.S. Cl. ........................ 324/322; 128/653.5
[58] Field of Search ............................ 324/318, 322, 324/300; 128/653.5; 335/296, 299

[56] References Cited

U.S. PATENT DOCUMENTS

| | | | |
|---|---|---|---|
| 4,668,904 | 5/1987 | Kupiainen | 223/350 |
| 5,079,503 | 1/1992 | Siebold et al. | 324/309 |
| 5,245,287 | 9/1993 | Nowak et al. | 324/318 |
| 5,270,657 | 12/1993 | Wirth et al. | 324/322 |
| 5,278,506 | 1/1994 | Schmitt | 324/322 |
| 5,285,161 | 2/1994 | Rzedzian et al. | 324/318 |
| 5,298,863 | 3/1994 | Nowak et al. | 324/318 |
| 5,521,507 | 5/1996 | Rohan et al. | 324/318 |

*Primary Examiner*—Sandra L. O'Shea
*Assistant Examiner*—Roger Phillips
*Attorney, Agent, or Firm*—Hill, Steadman & Simpson

[57] ABSTRACT

The current supply of a gradient coil in a magnetic resonance tomography apparatus with a gradient amplifier and a connectable capacitor that can be interconnected with the gradient coil to form a series resonant circuit. The gradient amplifier produces at least a part of the voltage needed for driving a predetermined gradient current through the gradient coil. The resonant frequency of the capacitor in combination with the gradient coil is lower than $\frac{1}{4}\, T_r$, whereby $T_r$ is the duration of a leading or trailing edge of the gradient current.

18 Claims, 6 Drawing Sheets

NMR GRADIENT POWER SUPPLY INCLUDING A RESONANT CIRCUIT HAVING A FREQUENCY WITH AN ASSOCIATED PERIOD BEING LESS THAN ONE-QUARTER DURATION OF THE GRADIENT CURRENT

BACKGROUND OF THE INVENTION

1. Field of the Invention

The present invention is directed to a power supply suitable for operating a gradient coil in a nuclear magnetic resonance tomography apparatus.

2. Description of the Prior Art

German OS 34 15 041 discloses a gradient power supply for a nuclear magnetic tomography apparatus having a controllable gradient amplifier and a following unit that contains a amplifier that can be switched in series with a gradient coil via a switch. The gradient amplifier thereby provides at least part of the voltage necessary for producing a predetermined current, and a voltage that may be additionally required is provided by a capacitor.

Short rise and decay times of the gradient pulses that could only be realized with significant circuit outlay with a linear gradient amplifier by itself can thus be realized by means of a resonant operation of the gradient coil. U.S. Pat. No. 5,245,287 discloses another gradient power supply with a resonant circuit. Leading and trailing edges of the gradients and a constant part of each gradient pulse are thereby non-resonantly generated via a gradient amplifier. Because only less than one-fourth cycle of a full oscillation of the resonant circuit is used for each of the leading and trailing edges, these edges can be implemented steeper than in a full sine oscillation. A pre-condition, however, is that the capacitor be charged to a higher voltage before the beginning of every readout sequence than would be required to produce a pure sine oscillation during the readout sequence.

SUMMARY OF THE INVENTION

An object of the invention is to provide a gradient power supply with which short leading and trailing edges are obtained given little outlay.

The above object is achieved in accordance with the principles of the present invention in a gradient current supply for a nuclear magnetic resonance tomography apparatus having a controllable gradient amplifier followed by a unit containing a capacitor switchable in series with a gradient coil by means of a number of switches, the voltage necessary for producing a predetermined gradient current being generated by the controllable gradient amplifier supplemented, if necessary, by voltage generated by the capacitor. The gradient current is in the form of a pulse having a leading edge and a trailing edge, and the capacitor and the gradient coil form a circuit having a resonant frequency which is less than one-quarter of the duration of the leading edge or the trailing edge of the gradient current.

DESCRIPTION OF THE PREFERRED EMBODIMENTS

Figure 1:
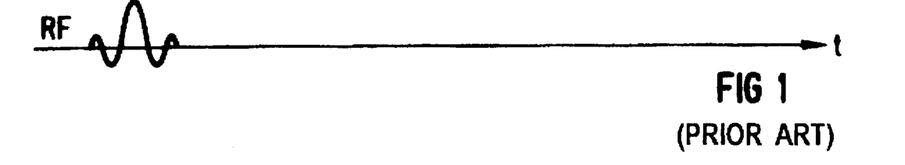
FIGS. 1–5 illustrate a known EPI sequence for explaining the problem which is solved by the present invention.
Figure 2:
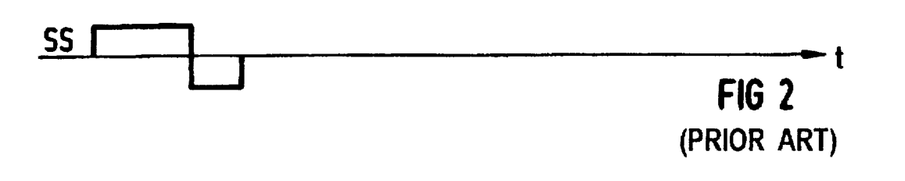

The problem of fast gradient switching is especially pronounced in the EPI (echo planar imaging) method. This method is therefore explained in brief with reference to FIGS. 1 through 5. According to FIG. 1, an exaltation pulse RF is emitted into the examination subject together with a gradient SS of FIG. 2 in the z-direction. Nuclear spins in a slice of the examination subject are thus excited. Subsequently, the direction of the gradient SS is inverted, whereby the negative gradient SS cancels the dephasing of the nuclear spins caused by the positive gradient SS.

Figure 3:
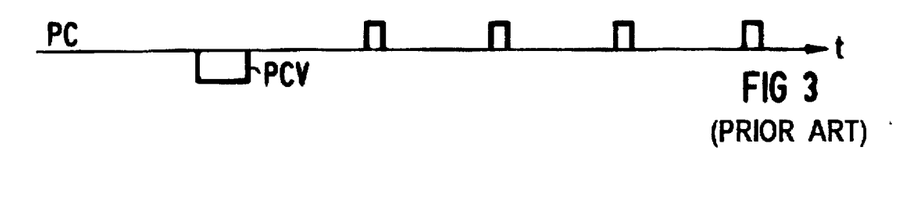
Figure 4:
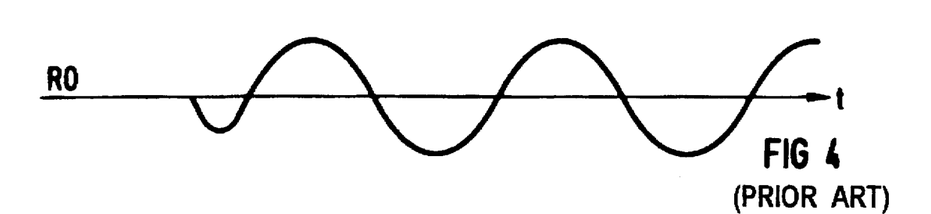
Figure 5:
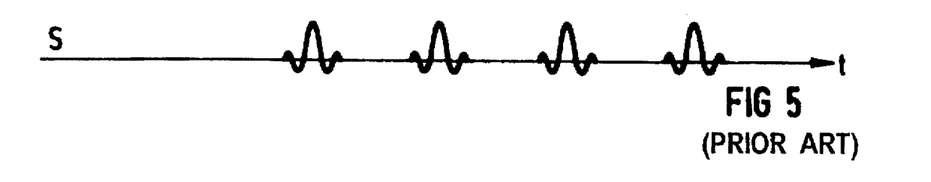

After the excitation, a phase-encoding gradient PC according to FIG. 3 and a readout gradient RO according to FIG. 4 are activated. The phase-encoding gradient PC is composed of short, individual pulses ("blips") that are activated at each polarity change of the readout gradient RO. The phase-encoding gradients PC are respectively preceded by a pre-phasing gradient PCV in negative phase-encoding direction.

Figure 6:
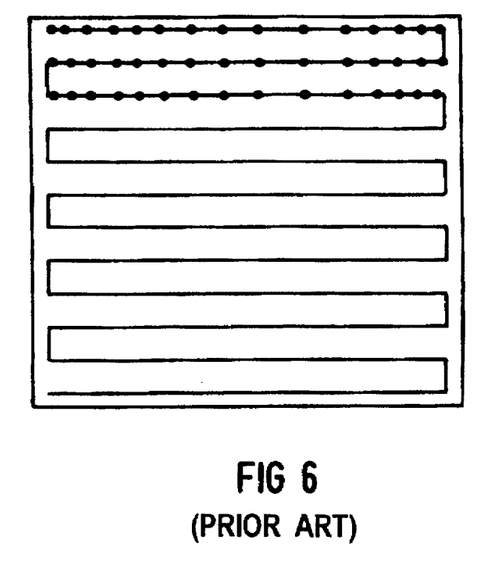
FIG. 6 shows the position of the sampled signals in the k-space given a sequence according to FIGS. 1 through 5.

The readout gradient RO is activated with periodically changing polarity, as a result of which the nuclear spins are dephased and in turn rephased in alternation. In a single excitation, so many signals are acquired that the entire Fourier k-space is sampled, i.e. the existing information suffices for reconstructing an entire tomogram. An extremely fast switching of the readout gradient with high amplitude is required for this purpose; this being virtually incapable of being realized with the square-wave pulses and conventional, controllable gradient amplifiers otherwise usually employed in MR imaging. A standard solution of the problem is to operate the gradient coil that generates the readout gradients RO in a resonant circuit, so that the readout gradient RO has a sinusoidal form. The arising nuclear magnetic resonance signals S are sampled in the time domain, digitized, and the numerical values acquired in this way are entered into a raw data matrix. The raw data matrix can be considered as being a measured data space, a measured data plane given the two-dimensional case of the exemplary embodiment. This measured data space is referred to as k-space in nuclear magnetic resonance tomography. The position of the measured data in the k-space is schematically illustrated by dots in FIG. 6. The information about the spatial origin of the signal contributions required for imaging is coded in the phase factors, whereby the relationship between the locus space (i.e., the image) and the k-space exists mathematically via a two-dimensional Fourier transformation. The following is valid:

$$S(k_x,k_y) = \iint \rho(x, y) e^{i(k_x x + k_y y)} dx\, dy$$

The following definitions thereby apply:

$$k_x(t) = \gamma \int_0^t G_x(t') dt'$$

-continued $$k(t) = \gamma \int_0^t G_y(t')dt'$$

wherein
ρ=gyromagnetic ratio
γ=nuclear spin density
$G_x$=value of the readout gradient RO
$G_y$=value of the phase-encoding gradient PC Extremely high gradient amplitudes are required in the EPI method for the location encoding of the radio-frequency signals. These high gradient amplitudes must be activated and deactivated at short time intervals, so that the required information can be acquired before the nuclear magnetic resonance signal decays. If it is assumed that a pulse duration T of one millisecond is required for a projection (i.e. for an individual signal under an individual pulse of the readout gradient RO), an overall readout time $T_{acq}$ of 128 ms derives for a 128×128 image matrix. If one were to use conventional square-wave pulses having a duration of one millisecond and were to assume a field of view (FOV) of 40 cm, then typical gradient amplitudes $G_x$ for the readout pulse RO for square-wave pulses would be:

$$G_x = \frac{2\pi}{\gamma \delta t FOV} = 7.5 mT/m$$

Even larger gradient pulses $G_T$ derive for trapezoidal pulses having a rise time of $T_{rise}$=0.5 ms and without readout of the signals on the ramps.

$$G_T = G_R \frac{T}{T - T_{rise}} = 2G_R = 15 mT/m$$

The demands made on the electric strength of the gradient amplifier in the gradient power supply become increasingly problematical with decreasing rise time. If it is assumed that a current $I_{max}$ is required for reaching the maximum gradient strength $G_{max}$, then the voltage required due to an inductance L of the gradient coil is calculated as:

$$U = -L\frac{di}{dt}$$

The ohmic voltage drop at the gradient coil has not yet been taken into account. For an inductance of the gradient coil of 1 mH and a maximum current $I_{max}$ of 200 A, the voltage required at the output of the gradient amplifier would assume the following values dependent on the rise time $T_{rise}$ of the gradient current:

$T_{rise}$ = 0.5 ms  $U$ = 400 V
$T_{rise}$ = 0.25 ms  $U$ = 500 V
$T_{rise}$ = 0.1 ms  $U$ = 2000 V.

Without a resonant circuit, these requirements can only be met with significant component outlay given short rise times; typically, at best by a parallel and series connection of modular gradient amplifiers.

The problem of the short switching times can be more simply solved when the gradient coil in question is operated together with a capacitor in a resonant circuit, whereby a sinusoidal curve of the readout gradient RO shown, for example, in FIG. 4 is then obtained. A disadvantage, however, is that an equidistant sampling in the k-space is not obtained in the sampling of the signal in temporally constant intervals, this being indicated by means of the non-equidistant dots in the k-space illustration of FIG. 6. The non-equidistant sampling in the k-space raises a number of problems in the image reconstruction and can lead to image artifacts. In order to avoid these problems, the aforementioned U.S. Pat. No. 5,245,287 proposes that only the leading and trailing edges of the gradient pulses be generated in the resonant mode, with the gradient pulse having a constant value therebetween. The leading and trailing edges, which respectively represent the steeper parts of a sine wave, are unusable in practice for the signal measurement and should therefore be kept as short as possible.

The principle of generating fast gradient ramps with a resonant circuit is explained below with reference to the simple circuit of FIG. 7. With the switch S1 closed, a gradient coil G is directly connected to a gradient amplifier GV; with the switch S2 closed, it is connected to the gradient amplifier GV via a capacitor C. In the latter instance, the gradient coil forms a series resonant circuit together with the capacitor C. When the capacitor C is charged, for example via the gradient amplifier GV or via a separate, auxiliary voltage source, then it stores energy $R_c$ in the form of voltage:

$$E_c = \frac{1}{2}C \cdot U^2$$

If a current with the intensity I flows through the gradient coil G with the inductance L, then the gradient coil G stores an energy $E_L$ in the form of current:

$$E_L = \frac{1}{2}L \cdot I^2$$

When the capacitor C is charged, the voltage of the capacitor C can be then applied to the gradient coil G by closing the switch S2. The current in the gradient coil G then proceeds sinusoidally from zero to the maximum current. As a result of the energy balance, the following relationship exists between capacitor voltage U and coil current I:

$$C \cdot U_2 = L \cdot I_2$$

By charging the capacitor C to a specific voltage U, it is always only a specific, maximum current intensity that can be driven through the gradient coil G.

A fast transfer of the energy from the capacitor C into the gradient coil G and vice versa is possible with a resonant circuit. If the rise time from zero up to the maximum current is referenced $T_R$, then the following relationship is obtained between $T_r$, the resonant frequency $f_r$, the inductance L of the gradient coil G and the capacitance C of the capacitor C:

$$\frac{1}{4T_r} = f_r = \frac{1}{2\pi\sqrt{L \cdot C}}$$

It can be derived from this equation that fast gradient ramps can only be achieved by raising the resonant frequency $f_r$. This is also true when only the leading and trailing edges are generated in resonant mode but a constant gradient is activated in non-resonant mode therebetween.

In the present invention, however, it has proved surprisingly beneficial to deviate from this dimensioning rule (high resonant frequency for short rise and decay times). This is explained in greater detail below on the basis of the circuit according to FIG. 8 and the diagrams according to FIGS. 9 through 11.

An important feature of the invention is that the gradient amplifier is not only active during constant gradient parts but also influences the gradient current in a controlled way during the leading and trailing edges. Leading and trailing edges thus can be generated, which are preferably linear, as shown in FIGS. 9 through 11.

Figure 8:
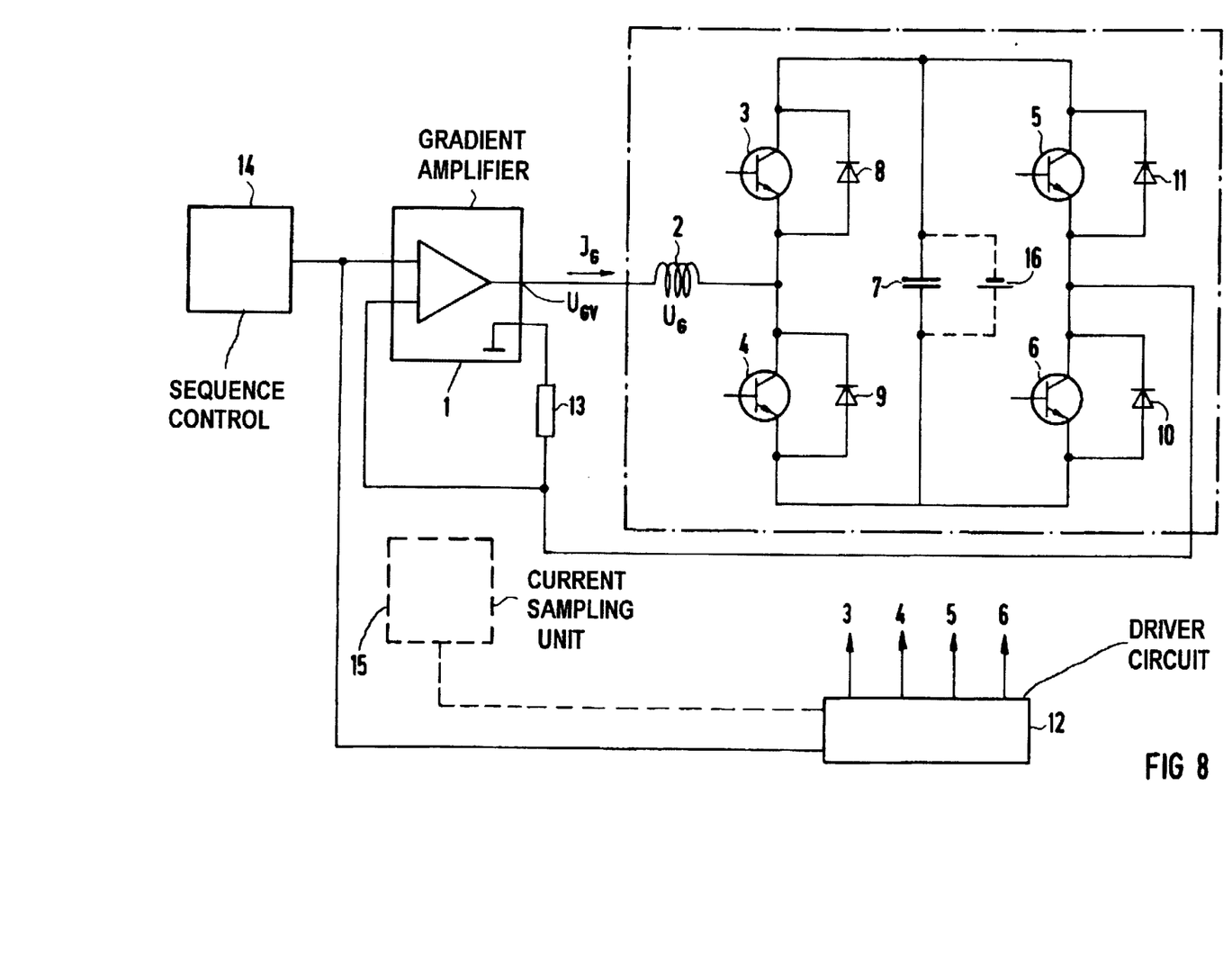
FIG. 8 is a circuit serving an exemplary embodiment of the inventive power supply.

A schematic circuit of the invention is shown in FIG. 8. The gradient pulses to be applied are predetermined by a sequence control 14. The predetermined value is compared to an actual value in a gradient amplifier 1, this actual value being obtained via a current sensor, for example a shunt 13 in the simplest case. A gradient coil 2 is connected to the gradient amplifier 1, via a connection directly on one side and via a bridge circuit on the other side. The bridge circuit is composed of four semiconductor switch elements, transistors 3 through 6 in the illustrated case. Respective free-running (unbiased) diode 8 through 11 are connected in parallel with each transistors 3 through 6. A capacitor 7 is connected in the bridge arm. The switches 3 through 6 are driven by a driver circuit 12 that is in turn driven either directly by the sequence control 14 or via a current rise sensor 15 for the gradient current.

Figure 9:
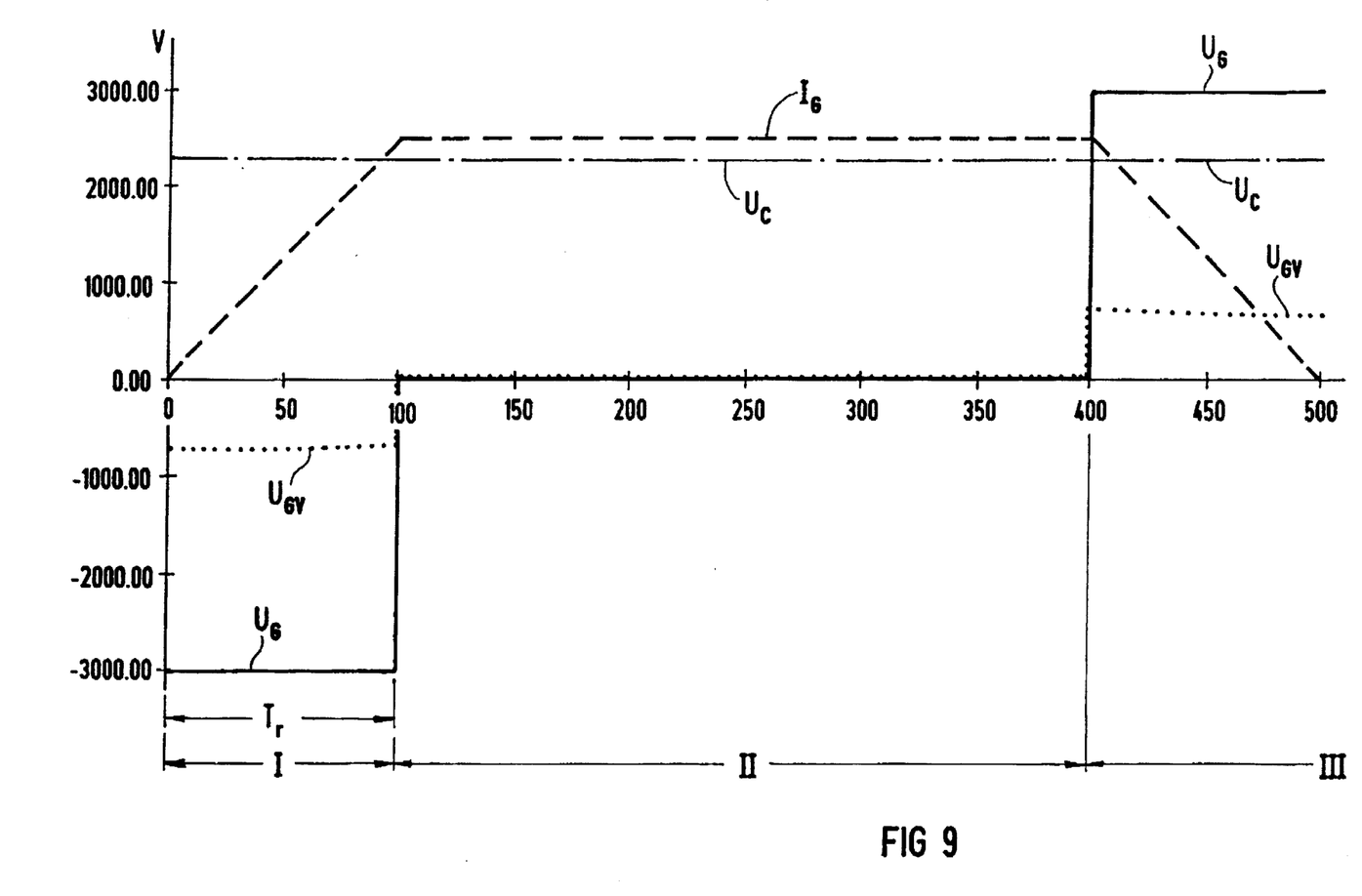
FIGS. 9–11 show various current and voltage curves in the inventive power supply dependent on the size of the capacitor.
Figure 10:
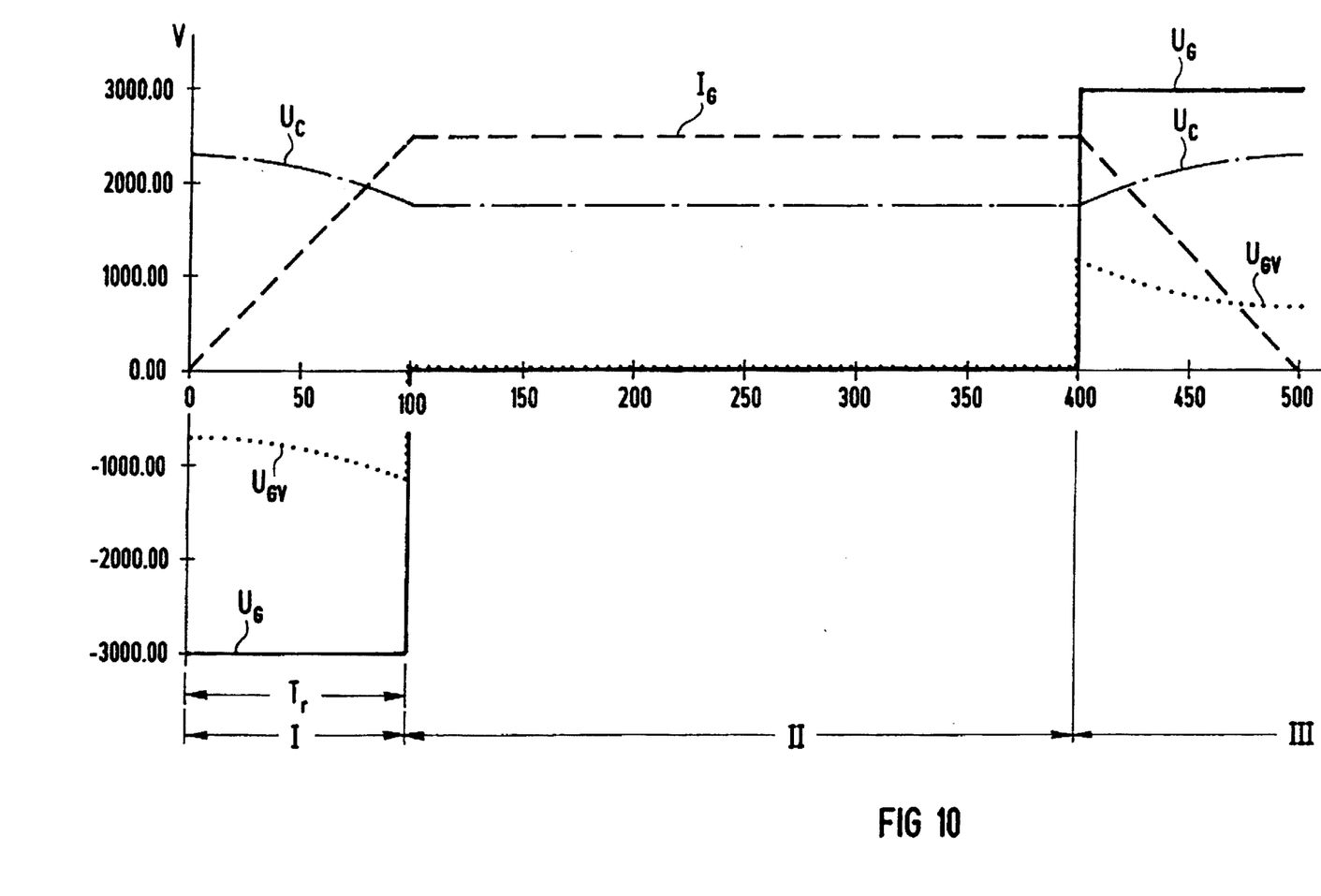
Figure 11:
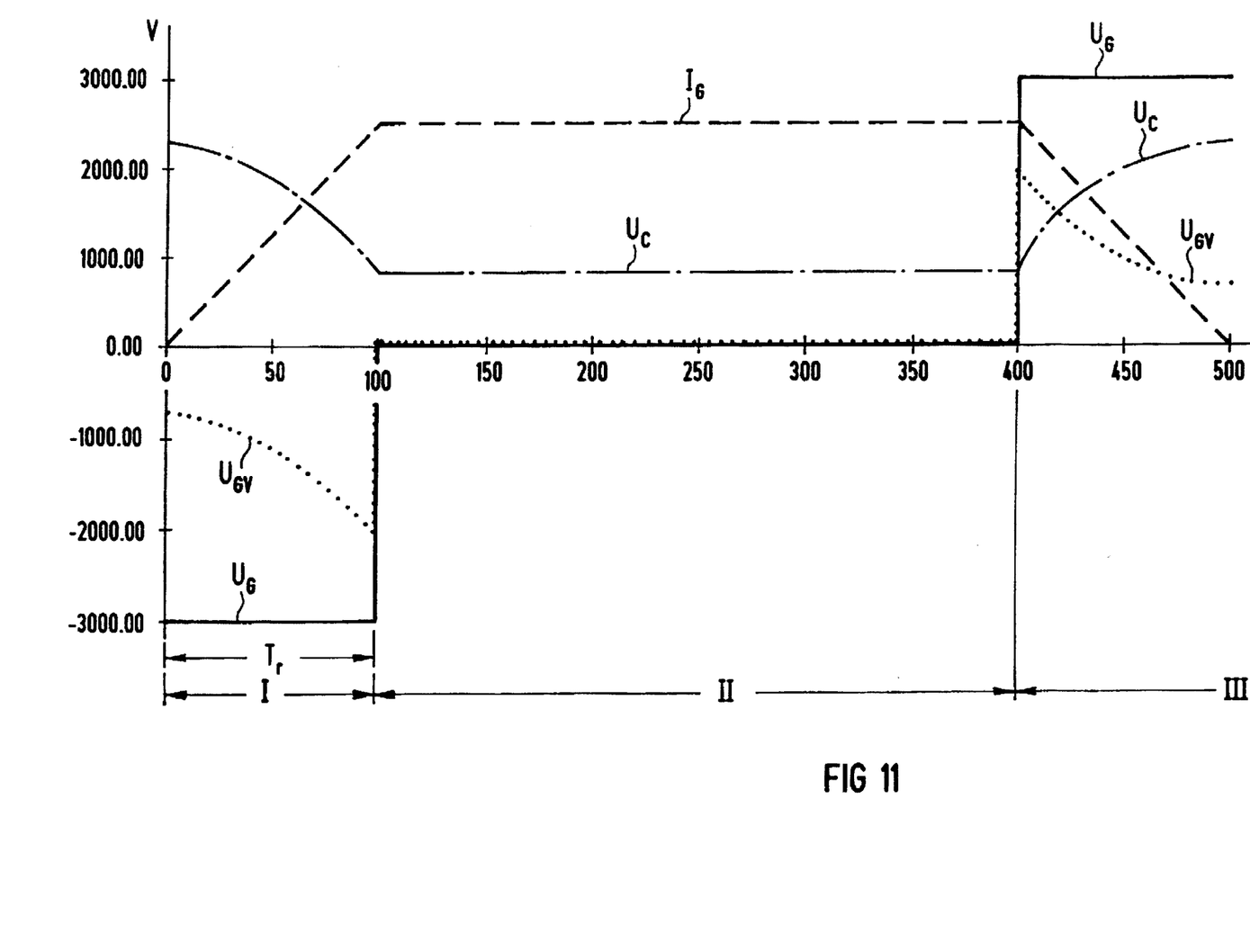

Various current and voltage curves in the circuit of FIG. 8 are shown in FIGS. 9 through 11, namely the current $I_G$ through the gradient coil 2, the voltage $U_{GV}$ at the output of the gradient amplifier 1, the voltage $U_G$ at the gradient coil 2 and the voltage $U_C$ at the capacitor 7. FIGS. 9 through 10 show these values for different capacitance values of the capacitor 7 and under pre-conditions that are otherwise the same, i.e. the following paremeters are assumed to be identical for FIGS. 9 through 11:

rise and decay time $T_r$=100 μs precharging of the capacitor 7 to 2300 V inductance of the gradient coil 1200 μH ohmic resistance of the entire circuit =200 mΩ.

The trapezoidal current pulse $I_G$ can be divided into three phases I through III, whereby the current rises linearly in phase I, remains constant in phase II and decreases linearly in phase III. It is thereby assumed that the capacitor is charged to a voltage $U_{CO}$=2300 V before the beginning of the current pulse $I_G$. It would be extremely complicated to design the gradient amplifier for such a high voltage. In the simplest case, the charge voltage is therefore generated with a separate, auxiliary voltage source 16, shown with broken lines in FIG. 8. The charge voltage $U_{CO}$, however, can alternatively be achieved by the gradient amplifier 1 first charging the gradient coil 2 with current, with the energy stored therein being transferred into the capacitor 7.

In phase I, the switches 4 and 5 are then closed, so that the capacitor 7 drives a rising current $I_G$ through the gradient coil 2. At the same time, however, the gradient amplifier 1 supplies a negative output voltage $U_{GV}$ of approximately –800 V. A relatively steep leading edge of the current pulse $I_G$ is thus obtained in phase I. The required output voltage $U_{GV}$ of the gradient amplifier 1 can be described in phase I with the following differential equation:

$$U_{GV} = R \cdot I_G(t) - L \cdot dI_G(t)/dt + \left( U_{CO} - \frac{1}{C \int I_G(t) dt} \right)$$

In phase II, the switches 3 and 5 are closed and the switches 4 and 6 are opened. The capacitor 7 is thus no longer effective; the gradient amplifier 1, given a constant current, need only balance the ohmic losses of the circuit:

$$U_{GV} = R \cdot I_G$$

In phase III, finally all switches 3 through 6 are open, so that the gradient current $I_G$ flows via the free-running diode 8, the capacitor 7 and the free-running diode 10. A steep voltage drop is thereby achieved by the voltage $U_C$ at the capacitor C as well as by the positive voltage $U_{GV}$ added thereto at the output of the gradient amplifier 1. The voltage $U_{GV}$ at the output of the gradient amplifier 1 can be specified by the following equation:

$$U_{GV} = R \cdot I_G(t) - L \cdot dI_G(t)/dt - \left( U_{CO} - \frac{1}{C \int I_G(t) dt} \right)$$

FIG. 10 shows the same quantities as FIG. 9, but for the capacitor 7 having a lower capacity, namely 26 μF instead of 527 μF. The resonant frequency thus becomes higher. This means the gradient amplifier 1 must operate over a larger voltage range $U_{GV}$ in order to maintain a linear leading edge given the dropping voltage $U_C$ at the capacitor 7. In order to arrive at the same rise time $T_r$, a higher maximum output voltage $U_{GV}$ is necessary at the gradient amplifier 1 (namely, about 1200 V instead of 800 V in the exemplary embodiment of FIG. 9), i.e. the gradient amplifier 1 becomes more complicated in design.

Figure 7:
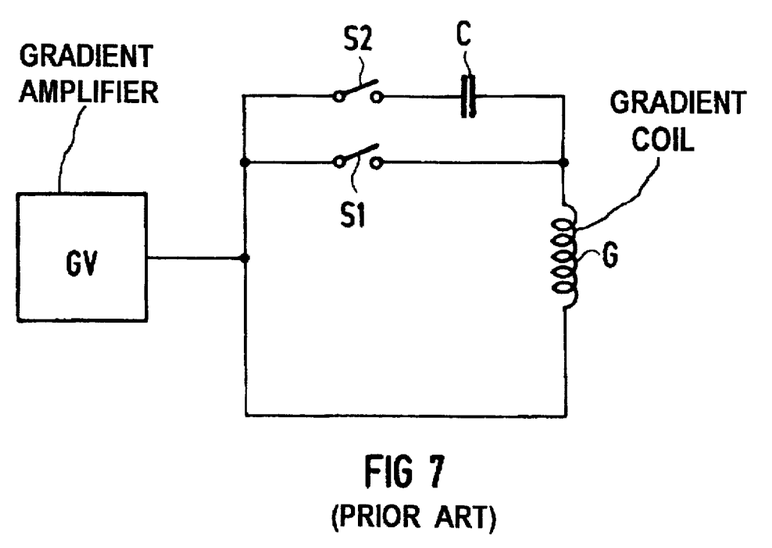
FIG. 7 shows a simple resonant circuit for explaining the current and voltage curves which arise in the operation of the inventive power supply.

In the exemplary embodiment of FIG. 7, wherein the capacity of the capacitor 1 only amounts to 9 μF, a gradient amplifier 1 having a maximum output voltage of nearly 2000 V is needed given the same rise time $T_r$.

In practice, the range of output voltage of the gradient amplifier 1 represents an important technical and economic criterion. The above considerations show a rise time $T_r$ can be achieved—given the same maximum output voltage of the gradient amplifier 1—which becomes shorter the higher the resonant frequency of the resonant circuit (composed of capacitor 7 and gradient coil 2) becomes, i.e. the larger the capacitor 7 is selected given an unaltered inductance of the gradient coil 2. This result is surprising in view of the observations made at the outset about the relationship between resonant frequency and rise time in gradient current supplies with resonant circuits.

Due to the described adjustment of the current edges in the phases I and III via the gradient amplifier 1, a fast linear rise of the gradient current $I_G$ can be achieved—even given limited electric strength of the gradient amplifier 1—when, as disclosed, the capacitor 7 is selected large enough.

The capacitor 7 need be cut in to the circuit in supporting fashion via the switches 3 through 6 only when the output voltage $U_{GV}$ of the gradient amplifier 1 no longer suffices to effect an adequately fast rise or drop in current through the gradient coil 2. The drive of the switches 3 through 6 can therefore ensue, for example, via a current sampling unit 15 that samples the rise of the current $I_G$, whereby the capacitor 7—dependent on the required polarity—is cut in by switching on the switches 4 and 5, or 3 and 6, as soon as the slope of the current $I_G$ falls below a certain value predetermined by the maximum output voltage of the gradient amplifier 1. The drive of the switches 3 through 6 via the driver circuit 12, however, can ensue directly from the sequence control 14 that prescribes the referenced value for the gradient current $I_G$.

Although modifications and changes may be suggested by those skilled in the art, it is the intention of the inventors to embody within the patent warranted hereon all changes and modifications as reasonably and properly come within the scope of their contribution to the art.

We claim as our invention:

1. A gradient current supply for generating a gradient current for a gradient coil in a nuclear magnetic resonance tomography apparatus, comprising:

a controllable gradient amplifier having a control loop associated therewith;

a unit connected in said control loop containing a capacitor and switching means for switching said capacitor into a series connection with said gradient coil, said gradient current amplifier and said control loop comprising means for generating a voltage for producing a predetermined gradient current supplied to said gradient coil, said voltage being generated by said gradient amplifier and supplemented, when necessary, by a voltage generated by said capacitor, said gradient current comprising a pulse having a leading edge and a trailing edge; and said capacitor, when in said series connection with said gradient coil, comprising a series combination having a resonant frequency with an associated period which is less than one-quarter of a duration of said leading edge of said gradient current.

2. A gradient current supply as claimed in claim 1 wherein said gradient amplifier generates an output voltage and wherein said capacitor generates a capacitor voltage, said output voltage and said capacitor voltage producing, in combination, minimally short leading and trailing edges of said gradient current.

3. A gradient current supply as claimed in claim 1 wherein said gradient amplifier generates an output voltage and wherein said capacitor generates a capacitor voltage, said output voltage and said capacitor voltage producing, in combination, linear leading and trailing edges of said gradient current.

4. A gradient current supply as claimed in claim 1 wherein said means for switching comprise means for charging said capacitor before conducting a measurement sequence of said tomography apparatus.

5. A gradient current supply as claimed in claim 1 wherein said capacitor has a capacitor voltage associated therewith required for a resonant mode operation of said gradient coil, and wherein said switching means comprises means for charging said capacitor to a voltage which is higher than said voltage required in said resonant mode.

6. A gradient current supply as claimed in claim 1 wherein said switching means comprise means for connecting said capacitor to said gradient coil only if said gradient amplifier does not, by itself, generate said voltage for producing said predetermined gradient current.

7. A gradient current supply as claimed in claim 1 wherein said switching means comprise a bridge circuit consisting of four switches in series with said gradient amplifier and said gradient coil and having a bridge diagonal, said capacitor being connected in said bridge diagonal, and further comprising an unbiased diode connected in parallel with each switch.

8. A gradient current supply as claimed in claim 1 further comprising means for operating said switches by measuring a slope of said gradient current and for connecting said capacitor to said gradient coil if said slope falls below a predetermined value.

9. A gradient current supply as claimed in claim 1 further comprising means for comparing a value of said gradient current to a predetermined value, and for operating said switching means to connect said capacitor to said gradient coil if said gradient current exceeds said predetermined value.

10. A gradient current supply for generating a gradient current for a gradient coil in a nuclear magnetic resonance tomography apparatus, comprising:

a controllable gradient amplifier having a control loop associated therewith;

a unit connected in said control loop containing a capacitor and switching means for switching said capacitor into a series connection with said gradient coil, said gradient current amplifier and said control loop comprising means for generating a voltage for producing a predetermined gradient current supplied to said gradient coil, said voltage being generated by said gradient amplifier and supplemented, when necessary, by a voltage generated by said capacitor, said gradient current comprising a pulse having a leading edge and a trailing edge; and said capacitor, when in said series connection with said gradient coil, comprising a series combination having a resonant frequency with an associated period which is less than one-quarter of a duration of said trailing edge of said gradient current.

11. A gradient current supply as claimed in claim 10 wherein said gradient amplifier generates an output voltage and wherein said capacitor generates a capacitor voltage, said output voltage and said capacitor voltage producing, in combination, minimally short leading and trailing edges of said gradient current.

12. A gradient current supply as claimed in claim 10 wherein said gradient amplifier generates an output voltage and wherein said capacitor generates a capacitor voltage, said output voltage and said capacitor voltage producing, in combination, linear leading and trailing edges of said gradient current.

13. A gradient current supply as claimed in claim 10 wherein said means for switching comprise means for charging said capacitor before conducting a measurement sequence of said tomography apparatus.

14. A gradient current supply as claimed in claim 10 wherein said capacitor has a capacitor voltage associated therewith required for a resonant mode operation of said gradient coil, and wherein said switching means comprises means for charging said capacitor to a voltage which is higher than said voltage required in said resonant mode.

15. A gradient current supply as claimed in claim 10 wherein said switching means comprise means for connecting said capacitor to said gradient coil only if said gradient amplifier does not, by itself, generate said voltage for producing said predetermined gradient current.

16. A gradient current supply as claimed in claim 10 wherein said switching means comprise a bridge circuit consisting of four switches in series with said gradient amplifier and said gradient coil and having a bridge diagonal, said capacitor being connected in said bridge diagonal, and further comprising an unbiased diode connected in parallel with each switch.

17. A gradient current supply as claimed in claim 10 further comprising means for operating said switches by measuring a slope of said gradient current and for connecting said capacitor to said gradient coil if said slope falls below a predetermined value.

18. A gradient current supply as claimed in claim 10 further comprising means for comparing a value of said gradient current to a predetermined value, and for operating said switching means to connect said capacitor to said gradient coil if said gradient current exceeds said predetermined value.

* * * * *